(12) United States Patent
Watanabe et al.

(10) Patent No.: US 10,996,001 B2
(45) Date of Patent: May 4, 2021

(54) HEATSINK

(71) Applicant: FURUKAWA ELECTRIC CO., LTD., Tokyo (JP)

(72) Inventors: Yosuke Watanabe, Tokyo (JP); Kenya Kawabata, Tokyo (JP); Yoshikatsu Inagaki, Tokyo (JP); Tatsuro Miura, Tokyo (JP); Kazuaki Aotani, Tokyo (JP); Toshiaki Nakamura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/009,206

(22) Filed: Sep. 1, 2020

(65) Prior Publication Data

US 2020/0393201 A1 Dec. 17, 2020

Related U.S. Application Data

(63) Continuation of application No. PCT/JP2020/016355, filed on Apr. 14, 2020.

(30) Foreign Application Priority Data

Apr. 17, 2019 (JP) .............................. JP2019-078219

(51) Int. Cl.
*F28D 15/02* (2006.01)
*F28F 3/02* (2006.01)
(Continued)

(52) U.S. Cl.
CPC ..... *F28D 15/0233* (2013.01); *F28D 15/0275* (2013.01); *F28D 15/046* (2013.01);
(Continued)

(58) Field of Classification Search
CPC ............. F28D 15/0233; F28D 15/0275; F28D 15/046; F28D 2021/0029; F28F 1/28; F28F 3/025; F28F 2215/00; H05K 7/20336
See application file for complete search history.

(56) References Cited

U.S. PATENT DOCUMENTS 3,563,309 A * 2/1971 Basiulis .................. F28D 15/06
165/104.26
4,632,179 A * 12/1986 Meijer ................ F28D 15/0233
126/117
(Continued)

FOREIGN PATENT DOCUMENTS

CN  103165547 A  6/2013
CN  107644855 A  1/2018
(Continued)

OTHER PUBLICATIONS

English translation of the Written Opinion of the International Searching Authority (Forms PCT/IB/345, PCT/IB/310 and PCT/ISA/237) for International Application No. PCT/JP2020/016355, dated Jul. 14, 2020.
(Continued)

*Primary Examiner* — Tho V Duong
(74) *Attorney, Agent, or Firm* — Birch, Stewart, Kolasch & Birch, LLP (57) ABSTRACT

The present disclosure provides a heatsink that can increase a fin area of a heat radiating fin while securing sufficient volumes of a heat receiving portion, heat insulating portion, and heat radiating portion even in an environment in which an installation space for the heatsink, more specifically, an installation space in a height direction of the heatsink is limited.
A heatsink including: a heat transport member having a heat receiving portion thermally connected to a heating element;
(Continued)

a pipe body connected to a heat radiating portion of the heat transport member; and a heat radiating fin group which is thermally connected to the pipe body and in which a plurality of heat radiating fins is arranged, wherein the heat transport member has an integral internal space that communicates from the heat receiving portion to a connection portion with the pipe body and that is filled with a working fluid, the internal space of the heat transport member communicating with an internal space of the pipe body, and a cross-sectional area of an internal space in a direction orthogonal to a heat transport direction of the heat transport member in the heat radiating portion is smaller than the cross-sectional area in a heat insulating portion between the heat receiving portion and the heat radiating portion.

8 Claims, 4 Drawing Sheets

(51) Int. Cl.
  *F28D 15/04* (2006.01)
  *F28F 1/28* (2006.01)
  *F28D 21/00* (2006.01)

(52) U.S. Cl.
  CPC .............. *F28F 1/28* (2013.01); *F28F 3/025* (2013.01); *F28D 2021/0029* (2013.01); *F28F 2215/00* (2013.01)

(56) References Cited

U.S. PATENT DOCUMENTS

| | | | | |
|---|---|---|---|---|
| 5,253,702 | A * | 10/1993 | Davidson | ............ F28D 15/0233 165/80.4 |
| 9,618,275 | B1 * | 4/2017 | Anderson | ............. F28D 15/046 |
| 2007/0240855 | A1 * | 10/2007 | Hou | ...................... F28D 15/046 165/104.26 |
| 2009/0084526 | A1 * | 4/2009 | Chang | ................... F28D 15/046 165/104.26 |
| 2009/0183866 | A1 | 7/2009 | Sakaue et al. | |
| 2016/0003555 | A1 | 1/2016 | Sun et al. | |
| 2018/0066896 | A1 | 3/2018 | Lin | |
| 2018/0294207 | A1 | 10/2018 | Huang | |
| 2019/0049190 | A1 * | 2/2019 | Liu | ..................... F28D 15/0233 |

FOREIGN PATENT DOCUMENTS

| | | |
|---|---|---|
| EP | 2933832 A1 | 10/2015 |
| JP | 55-102889 A | 8/1980 |
| JP | 61-34375 U | 3/1986 |
| JP | 61-125590 A | 6/1986 |
| JP | 6-120383 A | 4/1994 |
| JP | 2003-110072 A | 4/2003 |
| JP | 2006-313056 A | 11/2006 |
| JP | 2009-287821 A | 12/2009 |
| JP | 2011-46593 A | 3/2011 |
| JP | 2015-161448 A | 9/2015 |
| TW | 200947173 A1 | 11/2009 |
| TW | 201251152 A1 | 12/2012 |
| WO | WO 2015/167827 A1 | 11/2015 |

OTHER PUBLICATIONS

Japanese Office Action for Japanese Application No. 2019-078219, dated Jan. 14, 2014, with English translation.

Japanese Office Action for Japanese Application No. 2019-078219, dated Jun. 30, 2013, with English translation.

Taiwanese Office Action and Search Report for Taiwanese Application No. 109112976, dated Jul. 20, 2020, with English translation of the Office Action.

* cited by examiner

HEATSINK

CROSS REFERENCE TO RELATED APPLICATIONS

The present application is a continuation application of International Patent Application No. PCT/JP2020/16355 filed on Apr. 14, 2020, which claims the benefit of Japanese Patent Application No. 2019-078219, filed on Apr. 17, 2019. The contents of these applications are incorporated herein by reference in their entirety.

BACKGROUND

Technical Field

The present disclosure relates to a heatsink for cooling an electric/electronic component and the like.

Background

As a function of an electronic device is improved, many components including a heating element such as an electronic component are mounted at high density inside the electronic device. Also, with improvement in an electronic device, an amount of heat generated by a heating element such as an electronic component is increased. There is a case where a heatsink is used as a means to cool a heating element such as an electronic component. As a heatsink, a heat pipe-type heatsink including a tubular heat pipe is generally used.

As a heat pipe-type heatsink, for example, there is a heat pipe-type heatsink in which many flat plate-like heat radiating fins are provided in a manner of being protruded to outer peripheral surfaces of a plurality of tubular heat pipes (Japanese Patent Application Laid-Open No. 2003-110072). The heat pipe-type heatsink in Japanese Patent Application Laid-Open No. 2003-110072 is a heatsink that cools a heating element by transporting heat of the heating element to a heat radiating fin by a plurality of tubular heat pipes and by radiating the heat from the heat radiating fin.

On the other hand, recently, many components including a heating element such as an electronic component are mounted at increasingly higher density inside an electronic device. Thus, there is a case where an installation space for a heatsink is limited. Specifically, an installation space in a height direction of the heatsink may be limited. Also, since an amount of heat generated by an electronic component and the like is increased more and more, there is a case where further improvement in a cooling characteristic of the heatsink is required.

In a heatsink such as the heatsink in Japanese Patent Application Laid-Open No. 2003-110072 which heatsink transports heat of a heating element from a heat receiving portion to a heat radiating fin by a plurality of heat pipes, it is necessary to form a heat pipe group in which many heat pipes are arranged in parallel in order to increase an amount of heat transported from the heat receiving portion to the heat radiating fin and to improve cooling performance. Also, in order to improve the cooling performance of the heatsink, it is necessary to increase a fin area of the heat radiating fin in order to improve heat radiation performance of the heat radiating fin. However, in order to form the heat pipe group including many heat pipes and to increase the fin area of the heat radiating fin, it is necessary to secure a large space for installation of the heatsink inside an electronic device, more specifically, an installation space in a height direction of the heatsink. That is, in the heat pipe-type heatsink, there is room for improvement in space saving and improvement in cooling performance of the heatsink.

Also, there is an R portion in an outer peripheral surface of each heat pipe, and a void generated on an outer side of the R portion does not contribute to heat transport by the heat pipe group. Thus, volumes of a heat receiving portion, a heat insulating portion, and a heat radiating portion in the heat pipe group are not sufficient, and there is also a case where sufficient cooling performance is not acquired.

Furthermore, when the heat pipe group including many heat pipes is thermally connected to a heating element, an amount of heat received by the heat pipes varies depending on a distance from the heating element. Thus, there is a case where a heat pipe installed away from the heating element does not receive sufficient heat. Thus, there is a problem that cooling performance cannot be sufficiently improved since a heat input in the heat receiving portion of the heat pipe group cannot be sufficiently equalized and thermal resistance between the heat receiving portion of the heat pipe group and the heating element is increased.

SUMMARY

In view of the above situation, the present disclosure is to provide a heatsink that can increase a fin area of a heat radiating fin and equalize a heat input in a heat receiving portion while securing sufficient volumes of the heat receiving portion, a heat insulating portion, and a heat radiating portion even in an environment in which an installation space for the heatsink, more specifically, an installation space in a height direction of the heatsink is limited.

A summary of a configuration of a heatsink of the present disclosure is as follows.

[1] A heatsink including:
  a heat transport member having a heat receiving portion thermally connected to a heating element; a pipe body connected to a heat radiating portion of the heat transport member; and a heat radiating fin group which is thermally connected to the pipe body and in which a plurality of heat radiating fins is arranged, wherein
  the heat transport member has an integral internal space that communicates from the heat receiving portion to a connection portion with the pipe body and that is filled with a working fluid, the internal space of the heat transport member communicating with an internal space of the pipe body, and
  a cross-sectional area of an internal space in a direction orthogonal to a heat transport direction of the heat transport member in the heat radiating portion is smaller than the cross-sectional area in a heat insulating portion between the heat receiving portion and the heat radiating portion.

[2] The heatsink according to [1], wherein the cross-sectional area in the heat receiving portion is the same as the cross-sectional area in the heat insulating portion.

[3] The heatsink according to [1], wherein the cross-sectional area in the heat receiving portion is larger than the cross-sectional area in the heat insulating portion.

[4] The heatsink according to any one of [1] to [3], wherein the pipe body is extended in an arrangement direction of the heat radiating fins.

[5] The heatsink according to any one of [1] to [4], wherein an extension direction of the pipe body is not parallel to the heat transport direction of the heat transport member.

[6] The heatsink according to any one of [1] to [5], wherein a plurality of the pipe bodies is provided and is extend in a plurality of directions from the heat transport member.

[7] The heatsink according to any one of [1] to [6], wherein at least one surface of the heat transport member has a planar shape.

[8] The heatsink according to any one of [1] to [7], wherein the heat transport member has a step portion in a direction orthogonal to the heat transport direction.

In the above aspect, in a heat transport member, a part thermally connected to a heating element to be cooled functions as a heat receiving portion, and a part connected to a pipe body functions as a heat radiating portion of the heat transport member. A working fluid receives heat from the heating element and a phase thereof is changed from a liquid phase to a gas phase in the heat receiving portion of the heat transport member, and a part of the gas-phase working fluid releases latent heat and the phase thereof is changed from the gas phase to the liquid phase in the heat radiating portion of the heat transport member. In an aspect of the heatsink of the present disclosure, heat of the heating element is transported by the heat transport member from the heat receiving portion of the heat transport member to the heat radiating portion of the heat transport member, and is further transported from the heat radiating portion of the heat transport member to the pipe body. Also, the working fluid the phase of which is changed into the gas phase when the heat transport member receives heat from the heating element flows from the heat transport member to the pipe body. When the gas-phase working fluid flows from the heat transport member to the pipe body, the pipe body receives heat from the heat transport member and further transfers the heat received from the heat transport member to a heat radiating fin group. When the pipe body transfers the heat received from the heat transport member to the heat radiating fin group, the phase of the gas-phase working fluid flowing from the heat transport member to the pipe body is changed into the liquid phase. The heat transferred from the pipe body to the heat radiating fin group is released from the heat radiating fin group to an environment outside the heatsink. Also, in the above aspect, a cross-sectional area of an internal space in a direction orthogonal to a heat transport direction of the heat transport member, that is, in a direction from the heat receiving portion to the heat radiating portion in the heat radiating portion is smaller than the cross-sectional area in the heat insulating portion. Thus, an internal space of the heat transport member has a part, in which a cross-sectional area varies, in a part between the heat insulating portion and the heat radiating portion.

Note that a "cross-sectional area of an internal space" in a "cross-sectional area of an internal space in a direction orthogonal to a heat transport direction of a heat transport member" means, in a case where a member such as a liquid-phase working fluid or a wick structure is housed in the internal space of the heat transport member, a cross-sectional area including the cross-sectional area of the member.

In an aspect of a heatsink of the present disclosure, an entire internal space of a heat transport member having a heat receiving portion communicates and is integrated unlike an internal space of a heat pipe group in which a plurality of heat pipes is arranged in parallel. Thus, according to the aspect of the heatsink of the present disclosure in which heatsink the heat transport member having the integral internal space transports heat of a heating element from the heat receiving portion to a connection portion with a pipe body thermally connected to a heat radiating fin, a reflux characteristic of a liquid-phase working fluid is good, and a heat input in the heat receiving portion can be equalized and thermal resistance in the heat receiving portion can be reduced even when an amount of heat generated by the heating element is increased. Also, according to an aspect of the heatsink of the present disclosure, a cross-sectional area of an internal space in a direction orthogonal to a heat transport direction of the heat transport member in a heat radiating portion is smaller than the cross-sectional area in a heat insulating portion. Thus, even in an environment in which an installation space for the heatsink is limited, more specifically, in an environment in which an installation space in a height direction of the heatsink is limited, it is possible to increase a fin area of a heat radiating fin group while securing sufficient volumes of the heat receiving portion, the heat insulating portion, and the heat radiating portion. Thus, according to an aspect of the heatsink of the present disclosure, good cooling performance can be delivered with respect to an object to be cooled even in an environment in which the installation space in the height direction of the heatsink is limited.

In such a manner, according to an aspect of the heatsink of the present disclosure, the fin area of the heat radiating fin group can be increased since the cross-sectional area in the heat radiating portion is smaller than the cross-sectional area in the heat insulating portion. Thus, heat radiation performance of the heat radiating fin group is improved, and good cooling performance can be delivered with respect to an object to be cooled. Also, according to the aspect of the heatsink of the present disclosure, the entire internal space of the heat transport member communicates and is integrated. Thus, it is possible to uniformly cool the entire heating element even when heat is generated unevenly in the heating element.

According to an aspect of the heatsink of the present disclosure, the cross-sectional area in the heat receiving portion is larger than the cross-sectional area in the heat insulating portion. Thus, even in a case where an installation space for the heatsink is limited specifically in the height direction of the heatsink, it is possible to prevent blockage of reflux to the heat receiving portion by pressure from a gas-phase working fluid when a liquid-phase working fluid flows back from the pipe body and the heat radiating portion of the heat transport member to the heat receiving portion.

According to an aspect of the heatsink of the present disclosure, the pipe body communicating with the internal space of the heat transport member is extended in an arrangement direction of the heat radiating fin. Thus, a gas-phase working fluid flows inside the pipe body in the arrangement direction of the heat radiating fin. Thus, fin efficiency of the heat radiating fin group is improved, and cooling performance of the heatsink is securely improved.

According to an aspect of the heatsink of the present disclosure, an extension direction of the pipe body is not parallel to the heat transport direction of the heat transport member. Thus, heat transported from the heat transport member to the pipe body is transported in a direction different from the extension direction (heat transport direction) of the heat transport member. Thus, it is possible to prevent an increase in a size of the heatsink in the extension direction (heat transport direction) of the heat transport member. As a result, a space can be saved.

According to an aspect of the heatsink of the present disclosure, a plurality of the pipe bodies is extended in a plurality of directions from the heat transport member. Thus, heat transported from the heat transport member is transported in the plurality of directions different from the extension direction (heat transport direction) of the heat transport member. Thus, it is possible to more securely prevent an increase in a size of the heatsink in the extension direction (heat transport direction) of the heat transport member.

According to an aspect of the heatsink of the present disclosure, the heat transport member has a step portion in a direction orthogonal to the heat transport direction. Thus, even when a forbidden region for an obstacle or the like is set in a region between the heat receiving portion and the heat radiating portion of the heat transport member, the heatsink can be installed in a desired position.

DETAILED DESCRIPTION

Figure 1:
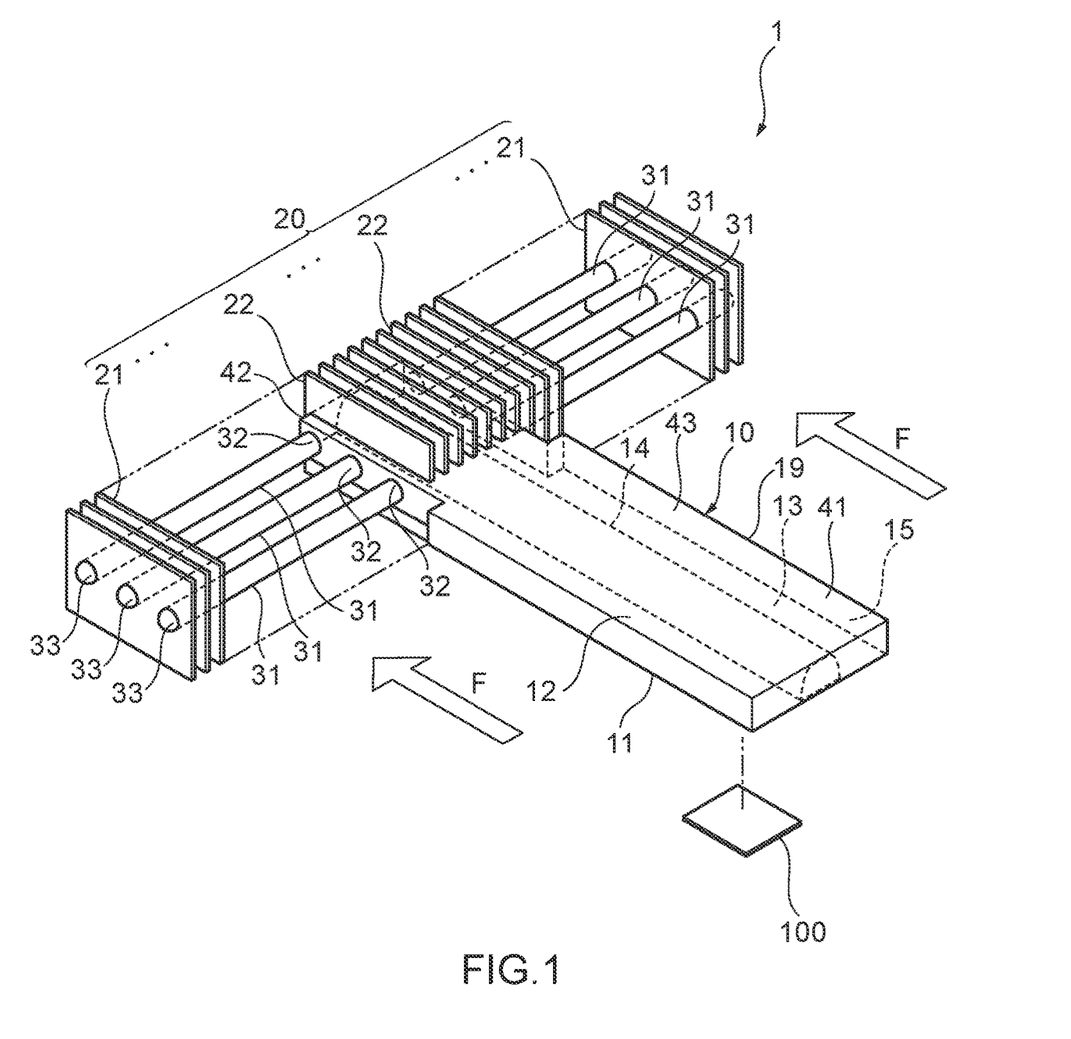
FIG. 1 A perspective view for describing an outline of a heatsink according to a first embodiment of the present disclosure.

In the following, heatsinks according to embodiments of the present disclosure will be described with reference to the drawings. First, a heatsink according to a first embodiment of the present disclosure will be described. FIG. 1 is a perspective view for describing an outline of the heatsink according to the first embodiment of the present disclosure, and FIG. 2 is a plan cross-sectional view for describing the outline of the heatsink according to the first embodiment of the present disclosure.

As illustrated in FIG. 1, a heatsink 1 according the first embodiment of the present disclosure includes a heat transport member 10 having a heat receiving portion 41 thermally connected to a heating element 100, a heat radiating fin group 20 thermally connected to the heat transport member 10, and a pipe body 31 thermally connected to the heat radiating fin group 20. The heat radiating fin group 20 includes a plurality of first heat radiating fins 21, 21, . . . attached to the pipe body 31, and a plurality of second heat radiating fins 22, 22, . . . that has a smaller area than the first heat radiating fins 21 and that is attached to the heat transport member 10. In a heat radiating portion 42 of the heat transport member 10, the pipe body 31 is connected to the heat transport member 10. Also, an internal space of the heat transport member 10 communicates with an internal space of the pipe body 31. That is, in the heatsink 1 according to the first embodiment, the heat transport member 10 has an integral internal space that communicates from the heat receiving portion 41 to a connection portion with the pipe body 31 and that is filled with a working fluid (not illustrated).

Figure 2:
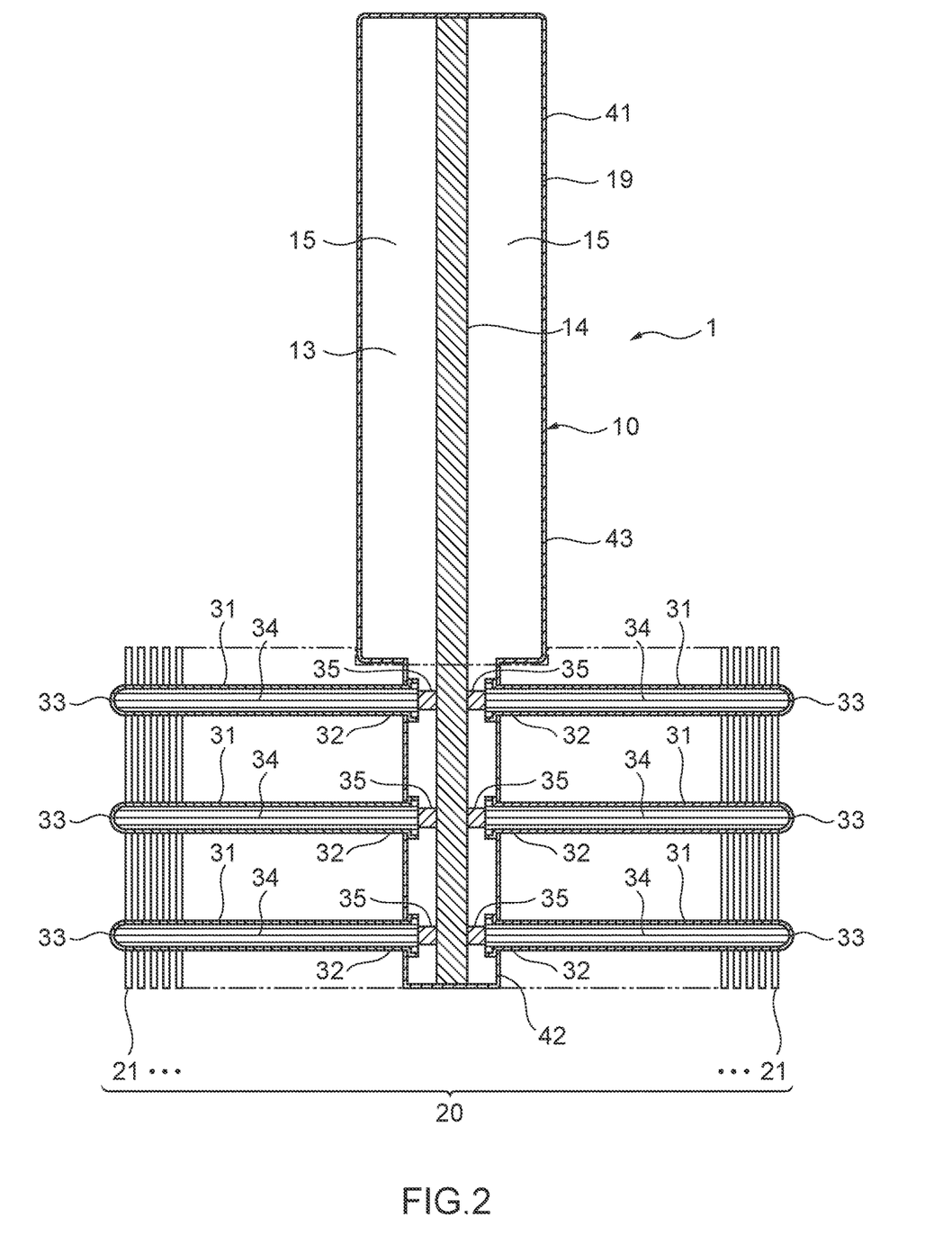
FIG. 2 A plan cross-sectional view for describing the outline of the heatsink according to the first embodiment of the present disclosure.

As illustrated in FIGS. 1 and 2, the heat transport member 10 includes a container 19 having a hollow cavity 13, and a working fluid flowing in the cavity 13. A wick structure 14 having capillary force is housed in the cavity 13. The container 19 is formed by joining of one plate-like body 11, and the other plate-like body 12 facing the one plate-like body 11.

The one plate-like body 11 has a plate shape having a side wall erected from a plane portion at an edge of the plane portion. The other plate-like body 12 also has a plate shape having a side wall erected from a plane portion at an edge of the plane portion. Thus, each of the one plate-like body 11 and the other plate-like body 12 has a recessed shape. The cavity 13 of the container 19 is formed by joining of the one recessed plate-like body 11 and the other recessed plate-like body 12. Thus, a shape of the container 19 is planar. The cavity 13 is an internal space that is sealed from an external environment, and is depressurized by deaeration processing.

A part of an outer surface of the container 19 to which part the heating element 100 to be cooled is thermally connected is the heat receiving portion 41, and the heating element 100 is cooled by being thermally connected to the container 19. In the heat transport member 10, the heat receiving portion 41 is formed at one end since the heating element 100 is thermally connected to the one end.

The heat transport member 10 is extended in a predetermined direction from a position of the heating element 100, and a second heat radiating fin 22 forming the heat radiating fin group 20 is thermally connected to the other end opposite to the one end. The other end of the heat transport member 10 to which the heat radiating fin group 20 is thermally connected functions as the heat radiating portion 42 of the heat transport member 10.

In the heat transport member 10, an intermediate portion placed between the heat receiving portion 41 placed at the one end of the container 19 and the heat radiating portion 42 placed at the other end of the container 19 functions as a heat insulating portion 43. The heat insulating portion 43 is a part to which neither the heat radiating fin group 20 nor the heating element 100 is thermally connected. Heat transferred from the heating element 100 to the heat receiving portion 41 is transported from the heat receiving portion 41 to the heat radiating portion 42 in an extension direction of the heat insulating portion 43. Thus, by securing a cross-sectional area of the internal space (that is, cavity 13) in a direction orthogonal to the heat transport direction of the heat transport member 10 (hereinafter, may be simply referred to as cross-sectional area of cavity 13) in the heat insulating portion 43 for a predetermined area or more, it is possible to contribute to providing the heat transport member 10 with a desired heat transport amount. Note that as described above, a "cross-sectional area of a cavity 13" means, in a case where a member such as a liquid-phase working fluid or the wick structure 14 is housed in the cavity 13 of the heat transport member 10, a cross-sectional area including the cross-sectional area of the member.

As illustrated in FIG. 1, in the heatsink 1, the cross-sectional area of the cavity 13 varies between the heat receiving portion 41 and the heat radiating portion 42. Specifically, in the heatsink 1, the cross-sectional area of the cavity 13 varies between the heat insulating portion 43 and the heat radiating portion 42. More specifically, the heatsink 1 has an aspect that the cross-sectional area of the cavity 13 in the heat radiating portion 42 is smaller than the cross-sectional area of the cavity 13 in the heat insulating portion 43. Also, the cross-sectional area of the cavity 13 in the heat insulating portion 43 is substantially the same as the cross-sectional area of the cavity 13 in the heat receiving portion 41.

In the heatsink 1, a thickness of the container 19 and wall thicknesses of the one plate-like body 11 and the other plate-like body 12 are substantially the same from one end to the other end of the container 19. Thus, the container 19 has a shape in which a size in a direction orthogonal to the heat transport direction (width direction) varies in planar view. Specifically, in planar view, a size of the heat transport member 10 in the width direction varies between the heat insulating portion 43 and the heat radiating portion 42. More specifically, an aspect that a size in the width direction of the heat transport member 10 in the heat radiating portion 42 is smaller than the size in the width direction of the heat transport member 10 in the heat insulating portion 43 is employed. Also, the size in the width direction of the heat transport member 10 in the heat insulating portion 43 is substantially the same as the size in the width direction of the heat transport member 10 in the heat receiving portion 41. Note that the "planar view" refers to a state of being viewed in a direction vertical to a plane portion of the heat transport member 10.

A ratio of the cross-sectional area of the cavity 13 in the heat radiating portion 42 to the cross-sectional area of the cavity 13 in the heat insulating portion 43 is not specifically limited as long as being smaller than 1.0, but is preferably equal to or larger than 0.5 and smaller than 1.0, is more preferably equal to or larger than 0.7 and equal to or smaller than 0.9, and is particularly preferably equal to or larger than 0.8 and equal to or smaller than 0.9 from a point of making a gas-phase working fluid flow smoothly to the heat radiating portion 42 while further increasing a fin area of the heat radiating fin group 20 by increasing the number of installed first heat radiating fins 21 having a larger area than the second heat radiating fins 22 (as described later) even in a case where an installation space for the heatsink 1, more specifically, an installation space in the height direction of the heatsink 1 is limited.

Also, in the heat transport member 10, the heat receiving portion 41, the heat insulating portion 43, and the heat radiating portion 42 are extended on the same plane. Thus, it is possible to prevent an increase in a size of the heatsink 1 in a height direction, more specifically, sizes of the heat receiving portion 41 and the heat insulating portion 43 in the height direction.

As illustrated in FIGS. 1 and 2, the wick structure 14 is extended from the heat receiving portion 41 to the heat radiating portion 42 of the container 19. The wick structure 14 is not specifically limited, and examples thereof include a sintered body of metal powder such as copper powder, a metal mesh made of a metal wire, a groove (plurality of narrow groove), a nonwoven fabric, a metal fiber, and the like. In the heat transport member 10, a sintered body of metal powder is used as the wick structure 14. A part of the cavity 13 in which part the wick structure 14 is not provided functions as a steam flow channel 15 through which a gas-phase working fluid flows. The steam flow channel 15 is extended from the heat receiving portion 41 to the heat radiating portion 42 of the container 19 in such a manner as to correspond to the wick structure 14 being extended from the heat receiving portion 41 to the heat radiating portion 42 of the container 19. The heat transport member 10 transports heat of the heating element 100, which heat is received by the heat receiving portion 41, from the heat receiving portion 41 to the heat radiating portion 42 by a heat transport characteristic due to an operation of the working fluid.

As illustrated in FIGS. 1 and 2, pipe bodies 31 internal spaces of which communicate with the cavity 13 of the container 19 are provided at the other end, which is the heat radiating portion 42, of the heat transport member 10. Thus, a space from the cavity 13 of the heat transport member 10 to the inside of the pipe bodies 31 is filled with the working fluid flowing in the cavity 13. Although not being specifically limited, a shape of each of the pipe bodies 31 is a linear shape in a longitudinal direction and is a circular shape in a direction orthogonal to the longitudinal direction in the heatsink 1. Also, all of the pipe bodies 31 have substantially the same shape and size.

The pipe bodies 31 are extended in a direction substantially orthogonal to the heat transport direction of the heat transport member 10 along a plane direction of the heat transport member 10. In the heatsink 1, heat transported from the heat transport member 10 is transported by the pipe bodies 31 in a direction different from an extension direction of the heat transport member 10 since an extension direction of the pipe bodies 31 is not parallel to the heat transport direction of the heat transport member 10. Thus, it is possible to prevent an increase in a size of the heatsink 1 in the heat transport direction of the heat transport member 10 and to save a space of the heatsink 1.

In the heatsink 1, the plurality of pipe bodies 31 is provided and is extended in a plurality of directions from the heat transport member 10. In the heatsink 1, the pipe bodies 31 are extended in both right and left directions, that is, two directions with the heat radiating portion 42 of the heat transport member 10 as a center. Also, the same number of pipe bodies 31 (three in drawing) are respectively provided in the right and left directions with the heat radiating portion 42 of the heat transport member 10 as the center. Since the plurality of pipe bodies 31 is extended from the heat transport member 10 in a plurality of directions (two direction in heatsink 1), heat transported from the heat transport member 10 is transported in a plurality of directions (two direction in heatsink 1) different from the extension direction of the heat transport member 10. Thus, an increase in a size of the heatsink 1 in the extension direction of the heat transport member 10 can be more securely prevented.

An end portion 32 on a side of the cavity 13 (hereinafter, also referred to as "base portion") of each of the pipe bodies 31 is opened, and an end portion 33 opposite to the cavity 13 (hereinafter, also referred to as "leading-end portion") is closed. Also, the cavity 13 of the container 19 and the internal space of the pipe body 31 communicate with each other, and the internal space of the pipe body 31 is depressurized by deaeration processing as in the case of the cavity 13. Thus, the working fluid can flow between the cavity 13 of the container 19 and the internal space of the pipe body 31.

A through hole (not illustrated) for attachment of the pipe body 31 to the container 19 is formed in a side surface portion of the container 19. A shape and size of the through hole correspond to a shape and size of the pipe body 31. By insertion of the base portion 32 of the pipe body 31 into the through hole in the container 19, the pipe body 31 is connected to the container 19. Thus, the pipe body 31 and the container 19 include different members. A method of fixing the pipe body 31 attached to the container 19 is not specifically limited, and examples thereof include welding, soldering, brazing, and the like.

The pipe body 31 and the container 19 of the heat transport member 10 include different members. Thus, an arrangement, shape, size, and the like of the pipe body 31 can be freely selected, and a degree of freedom in designing of a shape of the heatsink 1 is improved. Also, in the heatsink 1, since the pipe body 31 can be attached to the container 19 by insertion of the pipe body 31 into the through hole in the container 19, assembly is easy.

As illustrated in FIG. 2, a different wick structure 34 that generates capillary force and that is different from the wick structure 14 housed in the container 19 is provided on an inner surface of the pipe body 31. The different wick structure 34 is not specifically limited, and examples thereof include a sintered body of metal powder such as copper powder, a metal mesh made of a metal wire, a groove, a nonwoven fabric, a metal fiber, and the like. In the pipe body 31, a plurality of narrow grooves formed in the inner surface of the pipe body 31 in such a manner as to cover the entire inner surface of the pipe body 31 is used as the different wick structure 34. The narrow grooves are extended in the longitudinal direction of the pipe body 31.

When necessary, the different wick structure 34 provided in the pipe body 31 may be connected, via a connection member 35, to the wick structure 14 provided in the heat transport member 10. A working fluid which releases latent heat and a phase of which is changed from a gas phase to a liquid phase inside the pipe body 31 flows back in a direction from the leading-end portion 33 to the base portion 32 of the pipe body 31 in the different wick structure 34 by capillary force of the different wick structure 34 inside the pipe body 31. The liquid-phase working fluid that flows back to the base portion 32 of the pipe body 31 flows from the different wick structure 34 to one end of the connection member 35. The liquid-phase working fluid that flows from the different wick structure 34 to the one end of the connection member 35 can flow from the one end to the other end in the connection member 35, and can flow back from the other end of the connection member 35 to the wick structure 14 of the heat transport member 10.

From the above, by provision of the connection member 35 between the wick structure 14 and the different wick structure 34, the working fluid the phase of which is changed into the liquid phase inside the pipe body 31 can flow back more smoothly from the pipe body 31 to the heat transport member 10. Examples of the connection member 35 include a wick member having capillary force, and more specifically include a metal mesh, a braided metal wire, a metal fiber, and the like. From the above, since a flowing characteristic of the liquid-phase working fluid between the pipe body 31 and the heat transport member 10 is improved, cooling performance of the heatsink 1 is further improved.

Examples of materials of the container 19 and the pipe body 31 include copper, a copper alloy, aluminum, an aluminum alloy, nickel, a nickel alloy, stainless steel, titanium, a titanium alloy, and the like. The working fluid to fill the cavity 13 of the container 19 and the internal space of the pipe body 31 can be arbitrarily selected according to compatibility with the materials of the container 19 and the pipe body 31, and examples thereof include water, fluorocarbons, hydrofluoroether (HFE), cyclopentane, ethylene glycol, a mixture thereof, and the like.

A thickness of the container 19 can be arbitrarily selected according to mechanical strength, weight, and the like and can be 0.5 to 3 mm, for example. A cross-sectional area of the cavity 13 in the heat insulating portion 43 can be, for example, 250 to 350 mm$^2$. The cross-sectional area of the cavity 13 in the heat radiating portion 42 can be, for example, 150 to 250 mm$^2$. Also, a diameter of the pipe body 31 can be arbitrarily selected according to mechanical strength, weight, and the like and can be 5 to 10 mm, for example.

As illustrated in FIG. 1, in the heat radiating fin group 20, a plurality of first heat radiating fins 21, 21, . . . and a plurality of second heat radiating fins 22, 22, . . . are formed and arranged in parallel. Both the first heat radiating fins 21 and the second heat radiating fins 22 are thin flat plate-like members. Among these, the first heat radiating fins 21 are placed on both sides of the heat radiating fin group 20. The first heat radiating fins 21 are attached and fixed to positions of pipe bodies 31, and are thermally connected to the pipe bodies 31. Also, the first heat radiating fins 21 are arranged in parallel at a predetermined interval in a direction substantially parallel to the longitudinal direction of the pipe bodies 31. Thus, the pipe bodies 31 are extended in an arrangement direction of the first heat radiating fins 21. Note that all of the first heat radiating fins 21 thermally connected to the pipe bodies 31 have the same shape and size.

The second heat radiating fins 22 are placed at a central portion of the heat radiating fin group 20. The second heat radiating fins 22 are attached and fixed to a position of the heat transport member 10 placed at the central portion of the heat radiating fin group 20, and are thermally connected to the heat transport member 10. The second heat radiating fins 22 are attached in an erected manner to the heat transport member 10. From the above, an area of a main surface of each of the second heat radiating fins 22 is smaller than an area of a main surface of each of the first heat radiating fins 21. All of the second heat radiating fins 22 thermally connected to the heat transport member 10 have the same shape and size.

The main surface of each of the first heat radiating fins 21 is a surface that mainly has a heat radiating function of the first heat radiating fin 21, and the main surface of each of the second heat radiating fins 22 is a surface that mainly has a heat radiating function of the second heat radiating fin 22. The main surfaces of the first heat radiating fins 21 and the main surfaces of the second heat radiating fins 22 are arranged to be in a direction substantially orthogonal to the extension direction of the pipe bodies 31, that is, the longitudinal direction of the pipe bodies 31. Cooling air F is supplied in a direction substantially parallel to the heat transport direction of the heat transport member 10. A method of thermally connecting the first heat radiating fins 21 to the pipe bodies 31 is not specifically limited, and any known method can be used. For example, a method of forming through holes in the first heat radiating fins 21 and inserting the pipe bodies 31 into the through holes, bonding by soldering, and the like are used. Also, a method of thermally connecting the second heat radiating fins 22 to the heat transport member 10 is not specifically limited, and any known method can be used. For example, a method of providing the second heat radiating fins 22 in an erected manner in the heat transport member 10 by providing, at end portions of the second heat radiating fins 22, fixing pieces (not illustrated) extended in a direction vertical to the main surfaces of the second heat radiating fins 22 and by connecting these fixing pieces to a plane of the heat transport member 10 can be used.

The heatsink 1 is forcibly air-cooled by a blower fan (not illustrated), for example. Cooling air F derived from the blower fan is supplied along the main surfaces of the first heat radiating fins 21 and the main surfaces of the second heat radiating fins 22, and the first heat radiating fins 21 and the second heat radiating fins 22 are cooled.

A material of the first heat radiating fins 21 and the second heat radiating fins 22 is not specifically limited, and examples thereof include metal such as copper, a copper alloy, aluminum, and an aluminum alloy, a carbon material such as graphite, a composite member using the carbon material, and the like.

Next, a mechanism of a cooling function of the heatsink 1 will be described. First, the heating element 100 that is an object to be cooled is thermally connected to one end of the container 19 of the heat transport member 10, and the one end is made to function as the heat receiving portion 41. When the one end of the container 19 receives heat from the heating element 100, the heat is transferred to a liquid-phase working fluid in the cavity 13 at the one end of the container 19, and the liquid-phase working fluid is changed into a gas-phase working fluid in the cavity 13 at the one end of the container 19. The gas-phase working fluid flows in the steam flow channel 15 from the one end of the container 19 to the other end that is the heat radiating portion 42. When the gas-phase working fluid flows from the one end to the other end of the container 19, the heat transport member 10 transports the heat from the one end to the other end. A part of the gas-phase working fluid that flows to the other end of the container 19 releases latent heat and a phase thereof is changed into a liquid phase, and the released latent heat is transferred to the second heat radiating fins 22 attached to the position of the heat transport member 10. The heat transferred to the second heat radiating fins 22 thermally connected to the heat transport member 10 is released to an environment outside the heatsink 1 via the second heat radiating fins 22. The working fluid the phase of which is changed into the liquid phase at the other end of the container 19 flows back from the other end to the one end of the container 19 by capillary force of the wick structure 14 housed in the cavity 13 of the heat transport member 10.

Also, since the cavity 13 of the container 19 and the internal spaces of the pipe bodies 31 connected to a side wall portion of the container 19 communicate with each other, a working fluid a phase of which is not changed into the liquid phase at the other end of the container 19 in the gas-phase working fluid changed from the liquid-phase working fluid flows from the cavity 13 of the container 19 into the internal spaces of the pipe bodies 31. The gas-phase working fluid that flows into the internal spaces of the pipe bodies 31 releases latent heat inside the pipe bodies 31 and is changed into the liquid-phase working fluid. The latent heat released inside the pipe bodies 31 is transferred to the first heat radiating fins 21 attached to positions of the pipe bodies 31. The heat transferred to the first heat radiating fins 21 thermally connected to the pipe bodies 31 is released to an environment outside the heatsink 1 via the first heat radiating fins 21. The working fluid the phase of which is changed from the gas phase into the liquid phase inside the pipe bodies 31 flows back from the central portions and the leading-end portions 33 of the pipe bodies 31 to the base portions 32 of the pipe bodies 31 by the capillary force of the different wick structures 34 in the inner surfaces of the pipe bodies 31. The liquid-phase working fluid that flows back to the base portions 32 of the pipe bodies 31 flows back from the base portions 32 of the pipe bodies 31 to the wick structure 14 provided in the heat transport member 10. The liquid-phase working fluid that flows back to the wick structure 14 provided in the heat transport member 10 flows back to the one end of the container 19 by the capillary force of the wick structure 14.

In the heatsink 1 according to an embodiment of the present disclosure, the entire cavity 13 of the heat transport member 10 communicates and is integrated unlike a cavity of the heat pipe group in which a plurality of heat pipes is arranged in parallel. From the above, in the heatsink 1, since the heat transport member 10 having the integral cavity 13 transports heat of the heating element 100 from the heat receiving portion 41 to the connection portion with the pipe bodies 31 thermally connected to the heat radiating fin group 20, a reflux characteristic of a liquid-phase working fluid is good, and a heat input in the heat receiving portion 41 can be equalized and thermal resistance in the heat receiving portion 41 can be reduced even when an amount of heat generated by the heating element 100 is increased.

Also, in the heatsink 1, a cross-sectional area of the cavity 13 of the heat transport member 10 varies between the heat receiving portion 41 and the heat radiating portion 42. Thus, even in an environment in which an installation space for the heatsink 1 is limited, it is possible to increase a fin area of the heat radiating fin group 20 while securing sufficient volumes of the heat receiving portion 41, a heat insulating portion 43, and the heat radiating portion 42 according to a condition of the installation space. Specifically, in the heatsink 1, the cross-sectional area of the cavity 13 in the heat radiating portion 42 is smaller than the cross-sectional area of the cavity 13 in the heat insulating portion 43 and the cross-sectional area of the cavity 13 in the heat receiving portion 41. Thus, the number of installed first heat radiating fins 21 with main surfaces having larger area than those of the second heat radiating fins 22 can be increased. Thus, even in a case where an installation space is limited specifically in a height direction of the heatsink 1, a fin area of the heat radiating fin group 20 can be increased. From the above, in the heatsink 1, even in a case where the installation space is limited, heat radiation performance of the heat radiating fin group 20 is improved, and good cooling performance can be delivered with respect to the heating element 100. Also, since the entire cavity 13 of the heat transport member 10 communicates and is integrated, the entire heating element 100 can be uniformly cooled even when heat is generated unevenly in the heating element 100.

Figure 3:
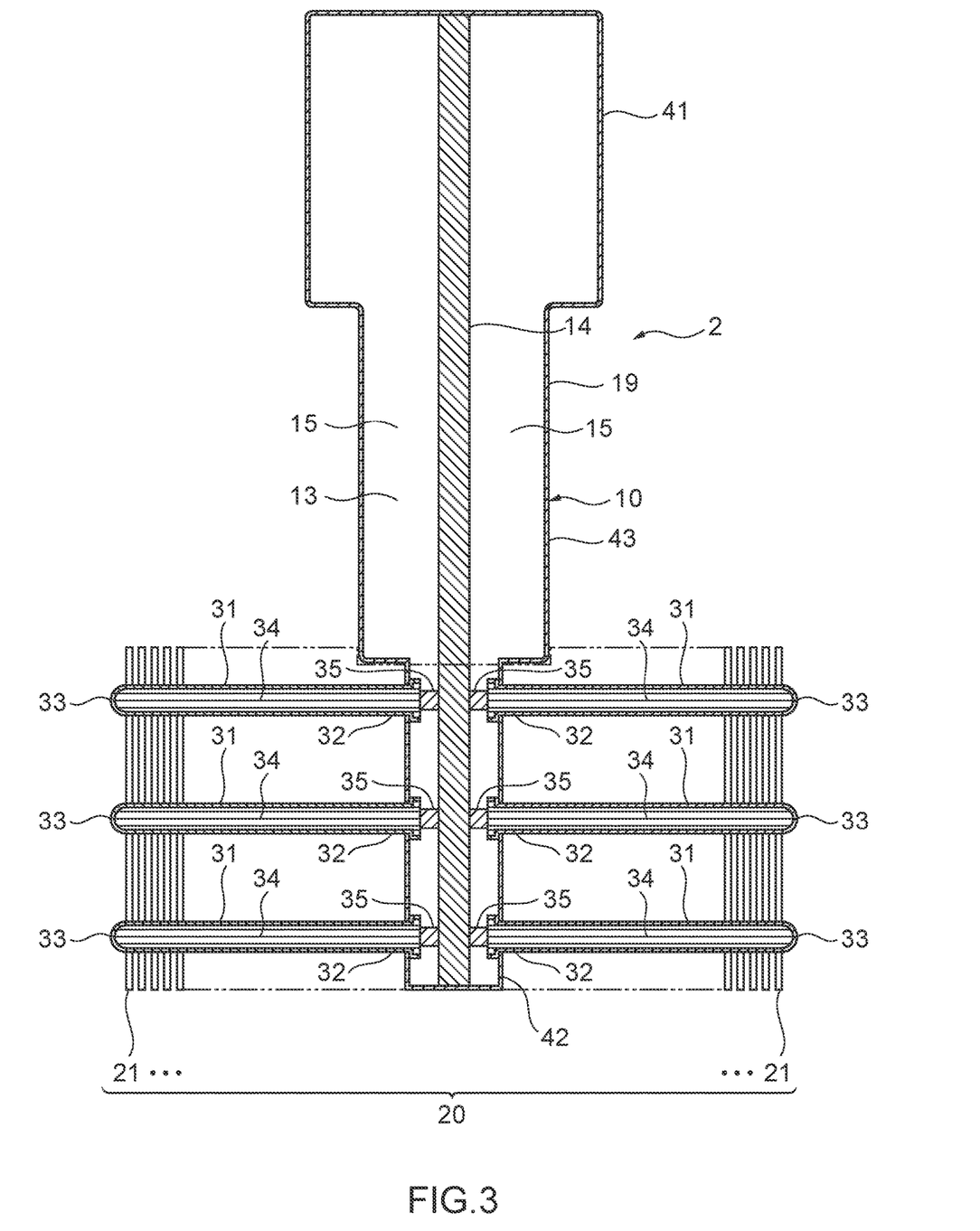
FIG. 3 A plan cross-sectional view for describing an outline of a heatsink according to a second embodiment of the present disclosure.

Next, a heatsink according to a second embodiment of the present disclosure will be described with reference to the drawing. Note that since the heatsink according to the second embodiment has a main portion in common with that of a heatsink according to the first embodiment, the same reference sign is used to describe the same component. Note that FIG. 3 is a plan cross-sectional view for describing an outline of the heatsink according to the second embodiment of the present disclosure.

In a heatsink according to the first embodiment, a cross-sectional area of the cavity in the heat receiving portion is substantially the same as the cross-sectional area of the cavity in the heat insulating portion with respect to the heat transport member. Alternatively, as illustrated in FIG. 3, a cross-sectional area of a cavity 13 in a heat receiving portion 41 is larger than the cross-sectional area of the cavity 13 in a heat insulating portion 43 with respect to a heat transport member 10 in a heatsink 2 according to the second embodiment. Thus, in the heatsink 2, an aspect that the cross-sectional area of the cavity 13 in a heat radiating portion 42 is smaller than the cross-sectional area of the cavity 13 in the heat insulating portion 43 and the cross-sectional area of the cavity 13 in the heat insulating portion 43 is smaller than the cross-sectional area of the cavity 13 in the heat receiving portion 41 is employed.

In the heatsink 2, a thickness and a wall thickness of the container 19 are substantially the same from the heat receiving portion 41 that is one end of the container 19 to the heat radiating portion 42 that is the other end thereof. Thus, as illustrated in FIG. 3, in the heatsink 2, an aspect that a size in a width direction of the heat transport member 10 in the heat radiating portion 42 is smaller than a size in the width direction of the heat transport member 10 in the heat insulating portion 43 and a size in the width direction of the heat transport member 10 in the heat insulating portion 43 is smaller than a size in the width direction of the heat transport member 10 in the heat receiving portion 41 is employed.

In the heatsink 2, a ratio of the cross-sectional area of the cavity 13 in the heat receiving portion 41 to the cross-sectional area of the cavity 13 in the heat insulating portion 43 is not specifically limited as long being larger than 1.0. However, from a point that it is possible to securely prevent blockage of reflux of a liquid-phase working fluid to the heat receiving portion 41 by pressure of a gas-phase working fluid while giving a desired heat transport amount to the heat transport member 10 even in a case where an installation space for the heatsink 2, more specifically, an installation space in a height direction of the heatsink 2 is limited, the ratio is preferably larger than 1.0 and equal or smaller than 1.5, and is particularly preferably equal to or larger than 1.2 and equal to or smaller than 1.4. Also, a ratio of the cross-sectional area of the cavity 13 in the heat radiating portion 42 to the cross-sectional area of the cavity 13 in the heat insulating portion 43 is not specifically limited as long as being smaller than 1.0 and is, for example, the same as that in the heatsink according to the first embodiment.

The cross-sectional area of the cavity 13 in the heat receiving portion 41 can be, for example, 350 to 450 mm$^2$.

In the heatsink 2, the cross-sectional area of the cavity 13 in the heat receiving portion 41 is larger than the cross-sectional area of the cavity 13 in the heat insulating portion 43. Thus, even in a case where an installation space for the heatsink 2 is limited specifically in the height direction of the heatsink 2, it is possible to prevent blockage of reflux to the heat receiving portion 41 by pressure from a gas-phase working fluid when a liquid-phase working fluid flows back from a pipe body 31 and the heat radiating portion 42 of the heat transport member 10 to the heat receiving portion 41.

Next, a heatsink according to a third embodiment of the present disclosure will be described with reference to the drawing. Note that since the heatsink according to the third embodiment has a main portion in common with those of heatsinks according to the first and second embodiments, the same reference sign is used to describe the same component. Note that FIG. 4 is a perspective view for describing an outline of the heatsink according to the third embodiment of the present disclosure.

Figure 4:
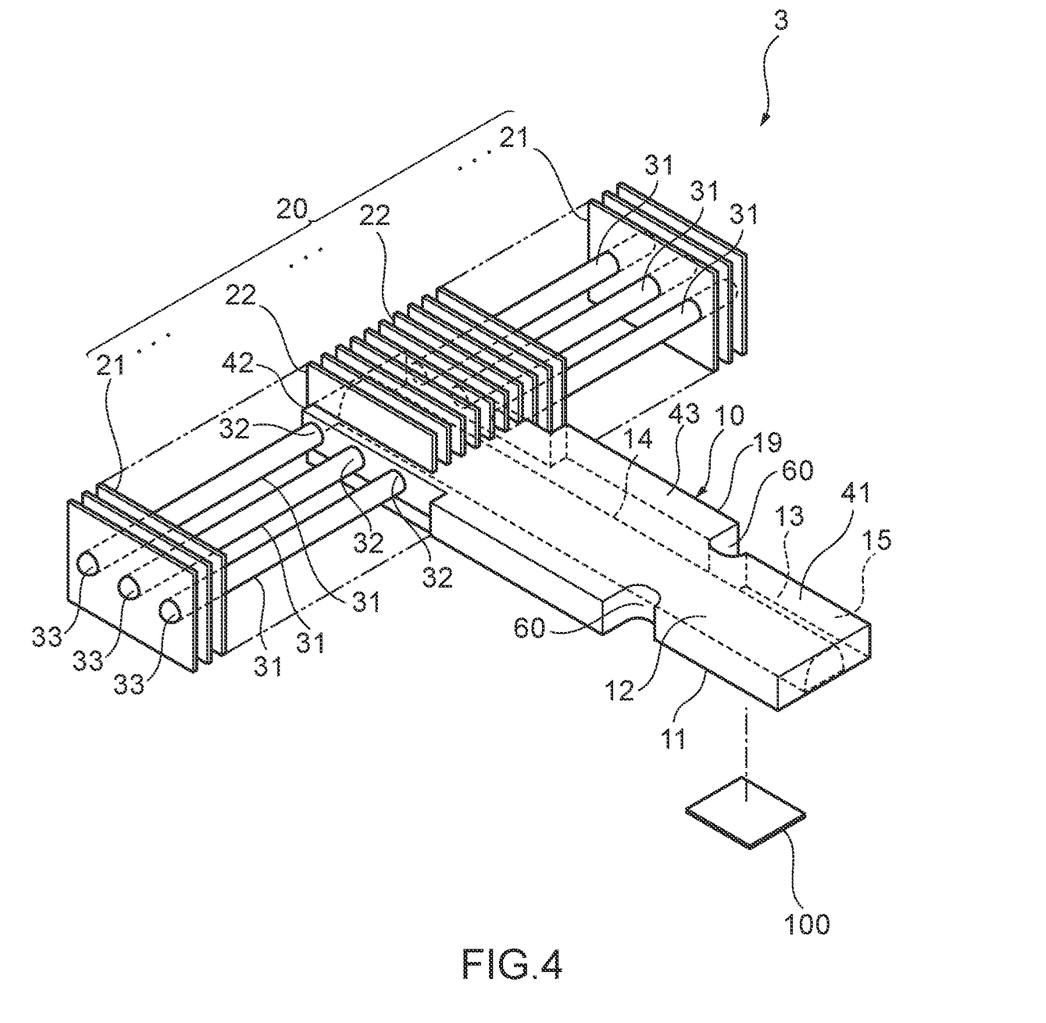
FIG. 4 A perspective view for describing an outline of a heatsink according to a third embodiment of the present disclosure.

As illustrated in FIG. 4, in a heatsink 3 according to the third embodiment, a constriction portion 60 in which a size in a width direction of a heat transport member 10 is smaller than those in a heat insulating portion 43 and a heat receiving portion 41 is included between the heat insulating portion 43 and the heat receiving portion 41 in planar view. Also, in the heatsink 3, the size in the width direction of the heat transport member 10 in the heat receiving portion 41 is smaller than the size in the width direction of the heat transport member 10 in the heat insulating portion 43.

In the heatsink 3, the constriction portion 60 is formed between the heat insulating portion 43 and the heat receiving portion 41. Thus, even in a case where an installation space in the width direction of the heat transport member 10 is limited in a region between the heat insulating portion 43 and the heat receiving portion 41, the heatsink 3 in which a fin area of a heat radiating fin group 20 is increased can be installed. Also, in the heatsink 3, the size in the width direction of the heat transport member 10 in the heat receiving portion 41 is smaller than the size in the width direction of the heat transport member 10 in the heat insulating portion 43. Thus, even in a case where an installation space in the width direction of the heat transport member 10 is limited in a region of the heat receiving portion 41, the heatsink 3 in which the fin area of the heat radiating fin group 20 is increased can be installed.

Next, a different embodiment of a heatsink of the present disclosure will be described in the following. In a heatsink according to each of the first and second embodiments, a heat receiving portion, a heat insulating portion, and a heat radiating portion of a heat transport member are extended along the same plane. Alternatively, a step portion in a direction substantially orthogonal to a heat transport direction of a heat transport member may be provided in the heat transport member. A position of the step portion can be between a heat insulating portion and a heat radiating portion, for example. Since the step portion is included, even when a forbidden region for an obstacle or the like is set in a region between the heat receiving portion and the heat radiating portion of the heat transport member, the heatsink can be installed in a desired position.

A heatsink of the present disclosure can increase a fin area of a heat radiating fin and deliver good cooling performance while securing sufficient volumes of a heat receiving portion, heat insulating portion, and heat radiating portion even in an environment in which an installation space, more specifically, an installation space in a height direction of the heatsink is limited. From the above, for example, the heatsink is highly useful in a field of cooling an electronic component that is installed in a narrow space and that generates a large amount of heat, the component being an electronic component such as a central processing unit, for example.

What is claimed is:

1. A heatsink comprising:
   a heat transport member having a heat receiving portion thermally connected to a heating element; a pipe body connected to a heat radiating portion of the heat transport member; and a heat radiating fin group which is thermally connected to the pipe body and in which a plurality of heat radiating fins is arranged, wherein
   the heat transport member has an integral internal space that communicates from the heat receiving portion to a connection portion with the pipe body and that is filled with a working fluid, the internal space of the heat transport member communicating with an internal space of the pipe body,
   a cross-sectional area of an internal space in a direction orthogonal to a heat transport direction of the heat transport member in the heat radiating portion is smaller than the cross-sectional area in a heat insulating portion between the heat receiving portion and the heat radiating portion,
   a wick structure extended from the heat receiving portion to the heat radiating portion is provided in the internal space of the heat transport member, a different wick structure is provided in an inner surface of the pipe body, and the wick structure and the different wick structure are connected via a connection member having capillary force, the connection member being a wick member having capillary force, and
   the wick structure provided in the heat transport member is a sintered body of metal powder, and the different wick structure provided in the pipe body is a plurality of narrow grooves.

2. The heatsink according to claim 1, wherein the cross-sectional area in the heat receiving portion is the same as the cross-sectional area in the heat insulating portion.

3. The heatsink according to claim 1, wherein the cross-sectional area in the heat receiving portion is larger than the cross-sectional area in the heat insulating portion.

4. The heatsink according to claim 1, wherein the pipe body is extended in an arrangement direction of the heat radiating fins.

5. The heatsink according to claim 1, wherein an extension direction of the pipe body is not parallel to the heat transport direction of the heat transport member.

6. The heatsink according to claim 1, wherein a plurality of the pipe bodies is provided and is extended in a plurality of directions from the heat transport member.

7. The heatsink according to claim 1, wherein at least one surface of the heat transport member has a planar shape.

8. The heatsink according to claim 1, wherein the heat transport member has a step portion in a direction orthogonal to the heat transport direction.

* * * * *